(12) United States Patent
Li et al.

(10) Patent No.: US 9,660,066 B2
(45) Date of Patent: May 23, 2017

(54) HIGH ELECTRON MOBILITY TRANSISTOR (71) Applicant: National Chiao Tung University, Hsinchu (TW)

(72) Inventors: Zhen-Yu Li, Hsinchu (TW); An-Jye Tzou, Hsinchu (TW); Hao-Chung Kuo, Hsinchu (TW); Chunyen Chang, Hsinchu (TW)

( * ) Notice: Subject to any disclaimer, the term of this patent is extended or adjusted under 35 U.S.C. 154(b) by 0 days.

(21) Appl. No.: 14/872,661

(22) Filed: Oct. 1, 2015

(65) Prior Publication Data

US 2016/0211330 A1 Jul. 21, 2016

(30) Foreign Application Priority Data

Jan. 21, 2015 (TW) .............................. 104101919 A (51) Int. Cl.
| | |
|---|---|
| H01L 29/06 | (2006.01) |
| H01L 29/778 | (2006.01) |
| H01L 29/207 | (2006.01) |
| H01L 29/10 | (2006.01) |
| H01L 29/20 | (2006.01) |
| H01L 21/02 | (2006.01) |

(52) U.S. Cl.
CPC ...... *H01L 29/7786* (2013.01); *H01L 21/0254* (2013.01); *H01L 21/02381* (2013.01); *H01L 21/02458* (2013.01); *H01L 21/02507* (2013.01); *H01L 21/02658* (2013.01); *H01L 29/1075* (2013.01); *H01L 29/2003* (2013.01); *H01L 29/207* (2013.01)

(58) Field of Classification Search
CPC .................................................... H01L 29/005
See application file for complete search history.

(56) References Cited

U.S. PATENT DOCUMENTS

2014/0091314 A1* 4/2014 Ishiguro ............ H01L 29/66462
257/76

* cited by examiner

*Primary Examiner* — Samuel Gebremariam (57) ABSTRACT

A high electron mobility transistor is provided, which includes a substrate, a superlattice structure formed on the substrate, and a transistor epitaxial structure formed on the superlattice structure such that the superlattice structure is interposed between the substrate and the transistor epitaxial layer. As the high electron mobility transistor has the carbon-doped AlN/GaN superlattice structure between the substrate and the transistor epitaxial layer. Thus, the present invention can effectively reduce vertical leakage current, so as to improve the epitaxial quality and the breakdown voltage of the high electron mobility transistor.

12 Claims, 7 Drawing Sheets

HIGH ELECTRON MOBILITY TRANSISTOR

CROSS-REFERENCE TO RELATED APPLICATIONS

The present invention claims benefit of priority to Taiwan Patent Application number 104101919, filed on Jan. 21, 2015, the entire disclosure of which is hereby incorporated by reference herein.

TECHNICAL FIELD

The present invention relates to high electron mobility transistors (HEMTs), and more particularly, relates to a high electron mobility transistor having AlN/GaN superlattice structure doped with carbon elements.

BACKGROUND

Figure 1:
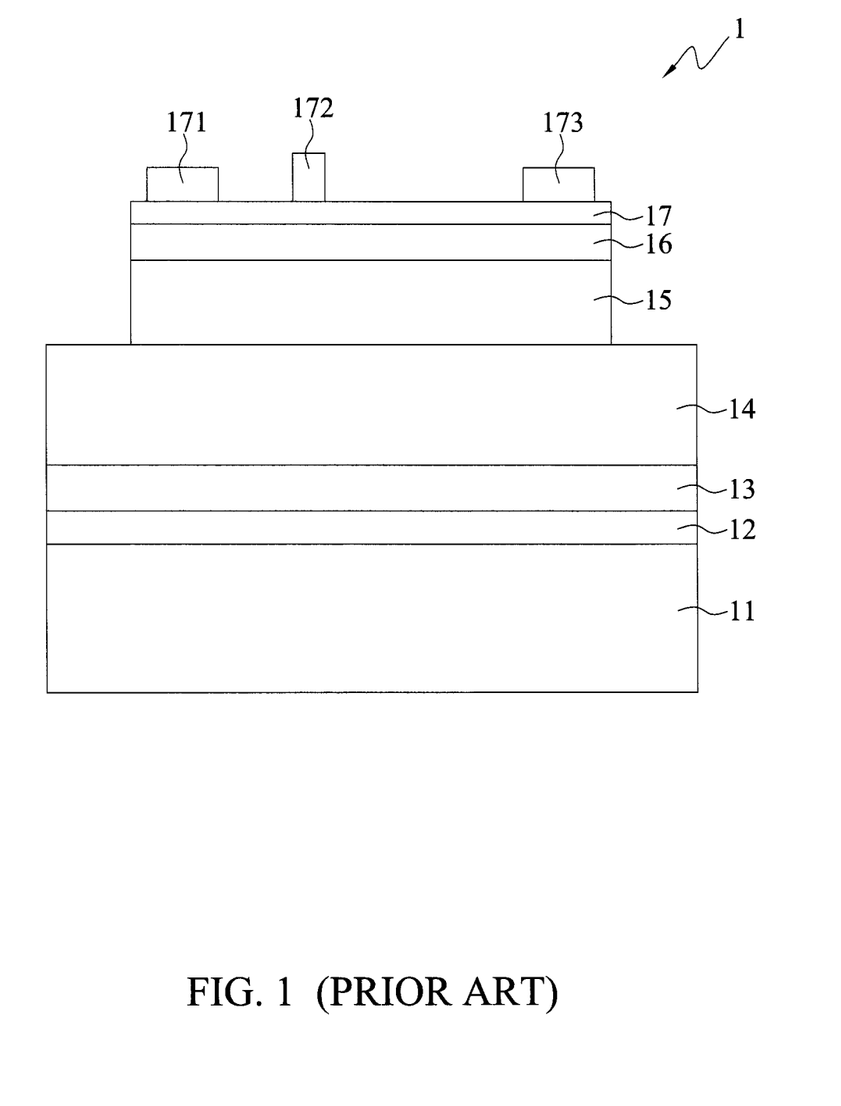
FIG. 1 is a schematic cross-sectional view showing a structure of a high electron mobility transistor according to the prior art.

The high electron mobility transistor is an important element in the field of high power and high frequency applications. As shown in FIG. 1, a high electron mobility transistor 1 using AlGaN/GaN as a double epitaxial layer according to the prior art comprises an aluminum nitride (AlN) layer 12, and an aluminum gallium nitride ($Al_xGa_{1-x}N$) layer 13 formed above the aluminum nitride layer 12. The aluminum nitride layer 12 is formed on a substrate 11, for example, a silicon (Si) substrate, and the aluminum nitride layer 12 is used to alleviate the problem of lattice mismatch between the substrate 11 and the aluminum gallium nitride layer 13. The aluminum content x of the aluminum gallium nitride ($Al_xGa_{1-x}N$) layer 13 is ranged from 1 to 0 according to the prior art, and there are a gallium nitride buffer layer 14, a gallium nitride channel layer 15, a barrier layer 16 and a gallium nitride covering layer 17 sequentially formed above the aluminum gallium nitride layer 13. There are a source 171, a drain 173 and a gate 172 individually formed on the gallium nitride covering layer 17.

However, a thickness of the aluminum nitride layer 12 of the high electron mobility transistor 1 according to the prior art is usually less than 100 nm, so that it cannot compensate the lattice mismatch between the substrate 11 and the aluminum gallium nitride layer 13 due to the thickness is too thin. Thus, a high dislocation can be generated easily, such that cracks occur when a thickness of the gallium nitride (GaN) grown on the substrate 11 is over 1 μm. Also, the defect density would exceed $10^9$ cm$^{-2}$, which results in reducing impedance of the epitaxial film, and the crystallization quality cannot be effectively improved. In other words, the high electron mobility transistor 1 of the prior art still has the problem of a large amounts of the vertical leakage current, resulting in lowering the breakdown voltage.

Consequently, how to provide a high electron mobility transistor with reduced vertical leakage current and improved breakdown voltage is one of the issues desired to be solved in the art.

SUMMARY

In view of the above-described drawbacks, the present invention provides a high electron mobility transistor, comprising: a substrate, a superlattice structure formed on the substrate, and a transistor epitaxial structure formed on the superlattice structure such that the superlattice structure is interposed between the substrate and the transistor epitaxial structure, wherein the superlattice structure is formed by alternately stacking a plurality of pairs of an aluminum nitride (AlN) layer and an gallium nitride (GaN) layer.

In an embodiment, the superlattice structure of the high electron mobility transistor of the present inventions is formed by alternately stacking a plurality of pairs of the aluminum nitride (AlN) layer and the gallium nitride (GaN) layer doped with carbon elements, such that a stress field exists inside the superlattice structure, which can force the defects changing the path of travel to reduce the penetration of the defects. In an embodiment, the carbon doping is p-type doping, and the holes generated can effectively compensate the background electrons, so as to reduce the loss caused by the vertical leakage current of the high electron mobility transistor, thereby improving the breakdown voltage, the epitaxial quality, and the impedance of the epitaxial film of the high electron mobility transistor.

DETAILED DESCRIPTION

The following illustrative embodiments are provided to illustrate the disclosure of the present invention, these and other advantages and effects can be apparent to those in the art after reading this specification.

Figure 2:
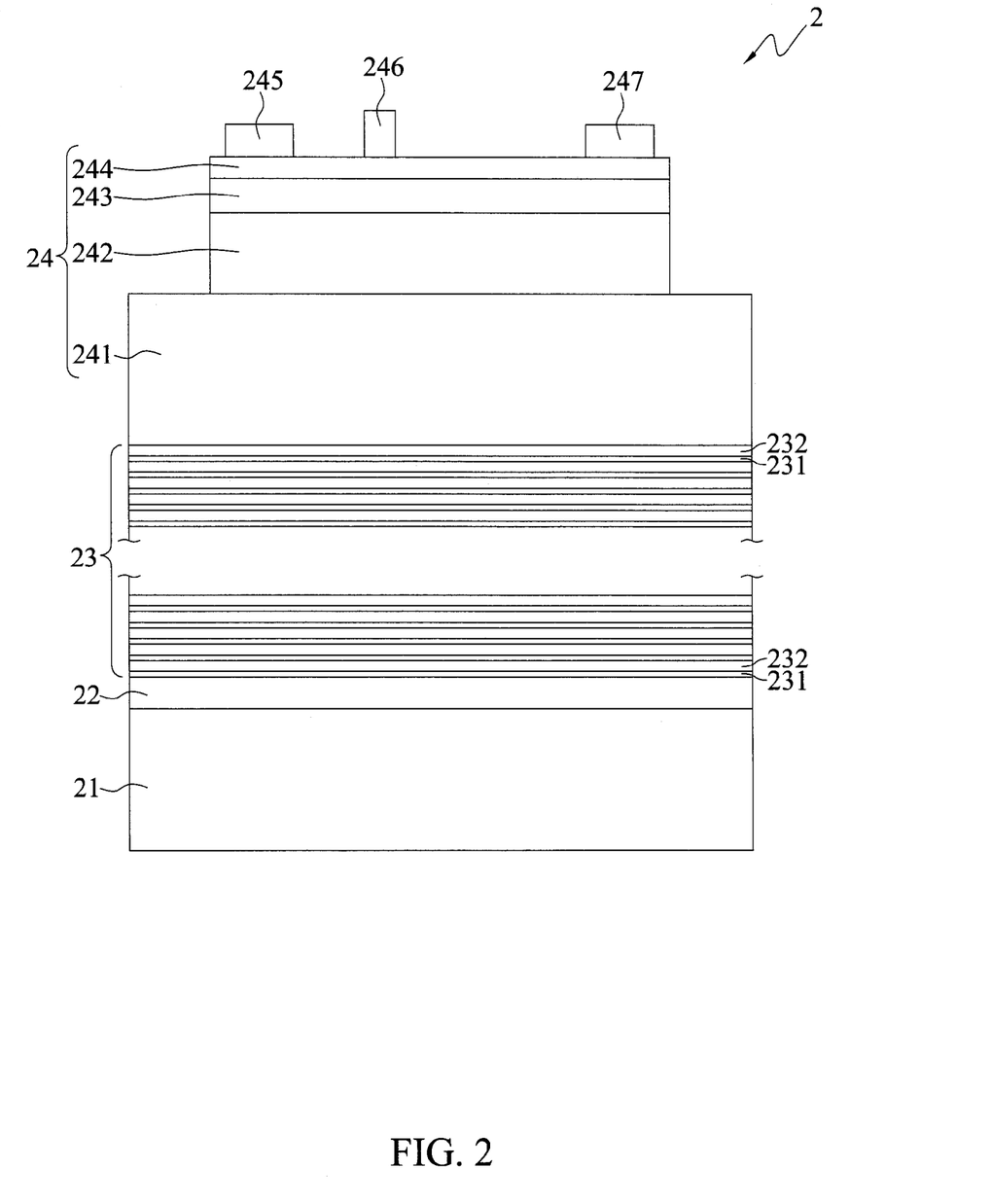
FIG. 2 is a schematic cross-section view showing a structure of a high electron mobility transistor according to the present invention.

Please refer to FIG. 2, a high electron mobility transistor 2 of the present invention comprises a substrate 21, an epitaxial layer 22 formed on the substrate 21, a superlattice structure 23 formed on the epitaxial layer 22, and a transistor epitaxial structure 24 formed on the superlattice structure 23.

The material of the substrate 21 can be made of a material selected from the group consisting of sapphire, silicon carbide (SiC), zinc oxide (ZnO), silicon (Si), gallium oxide ($Ga_2O_3$), and gallium nitride (GaN), but the present invention is not limited thereto. Taking the silicon substrate as an example, before growing on the substrate 21, the substrate 21 is firstly etched, i.e., the substrate 21 is boiled in a solution of sulfuric acid ($H_2SO_4$) and hydrogen peroxide ($H_2O_2$) with a ratio of 3:1 for 15 minutes, then soaked in the solution of hydrogen fluoride (HF) and water ($H_2O$) with a ratio of 1:10 for 15 seconds, so as to remove native oxide on the surface of the substrate 21. Next, the substrate 21 is processed with hydrogen thermal annealing under 1020 to 1050° C. for 5 to 10 minutes, so as to remove a surface passivation layer. After completing above processes, the epitaxial layer 22, the superlattice structure 23 and the transistor epitaxial structure 24 can be formed on the substrate 21 sequentially.

The epitaxial layer 22 consists of aluminum gallium nitride ($Al_xGa_{1-x}N$). In one embodiment, x represents aluminum content in the aluminum gallium nitride ($Al_xGa_{1-x}N$), where $0 \leq x \leq 1$, and the epitaxial layer 22 is a single layer structure with a thickness of 160 nm.

The superlattice structure 23 is formed on the epitaxial layer 22. The so called "superlattices" is a periodical alternative structure formed by two or more materials. The superlattice structure 23 of the high electron mobility transistor 2 of the present invention is formed by alternately stacking two materials of aluminum nitride (AlN) and gallium nitride (GaN). In one embodiment, the superlattice structure 23 is formed by alternately stacking a plurality of pairs of a aluminum nitride (AlN) layer 231 and a gallium nitride (GaN) layer 232, and the number of alternately stacked pairs is at least 5 and can be as more as 120. The number of alternately stacked pairs can be increased or decreased depending upon the actual need, and thus the upper limit of the number of alternately stacked pairs is not limited by the present invention. The thickness of the aluminum nitride layer 231 in each pair is ranged from 2 to 6 nm, preferably is 4.5 nm. The thickness of the gallium nitride layer 232 in each pair is ranged from 10 to 30 nm, preferably is 20 nm, but the present invention is not limited thereto.

In an embodiment, the aluminum nitride layer 231 or the gallium nitride layer 232 in the superlattice structure 23 comprises a dopant, which can be carbon (C), tellurium (Te), iron (Fe), magnesium (Mg) or zinc (Zn). In one embodiment, the dopant preferably is carbon, and the doping concentration of the dopant is larger than or equal to $1 \times 10^{16}$ $cm^{-3}$.

In an embodiment, the alternatively stacking is performed in the order that the aluminum nitride layer 231 is firstly formed on the epitaxial layer 22, and then the gallium nitride layer 232 is formed on the aluminum nitride layer 231. However, in the present invention, the alternatively stacking can also be performed in the order that gallium nitride layer 232 is firstly formed on the epitaxial layer 22, and then the aluminum nitride layer 231 is formed on the gallium nitride layer 232. The present invention is not limited to the order of forming the aluminum nitride layer 231 and the gallium nitride layer 232 on the epitaxial layer 22.

The transistor epitaxial structure 24 includes a buffer layer 241, a channel layer 242, a barrier layer 243 and a covering layer 244. The buffer layer 241 is formed on the superlattice structure 23 and consists of aluminum gallium nitride ($Al_sGa_{1-s}N$), wherein s represents aluminum content in the aluminum gallium nitride, and $0 \leq s \leq 1$. In one embodiment, the buffer layer 241 can include a dopant of carbon (C) or can be non-doped, the present invention is not limited thereto. The thickness of the buffer layer 241 preferably is 1.32 μm.

The channel layer 242 is formed on the buffer layer 241 and consists of non-doped gallium nitride (GaN). The thickness of the channel layer 242 preferably is 0.3 μm. The barrier layer 243 is formed on the channel layer 242 and consists of aluminum gallium nitride ($Al_vGa_{1-v}N$), wherein v represents aluminum content in the aluminum gallium nitride and is 0.25, the gallium content is 0.75 and the barrier layer 243 is formed as a single layer structure with a thickness of 20 nm.

The covering layer 244 is formed on the barrier layer 243, and the source 245, the drain 247 and the gate 246 are further individually formed on the covering layer 244. The covering layer 244 consists of non-doped gallium nitride (GaN) and is formed as a single layer structure with a thickness of 2 nm.

Figure 3:
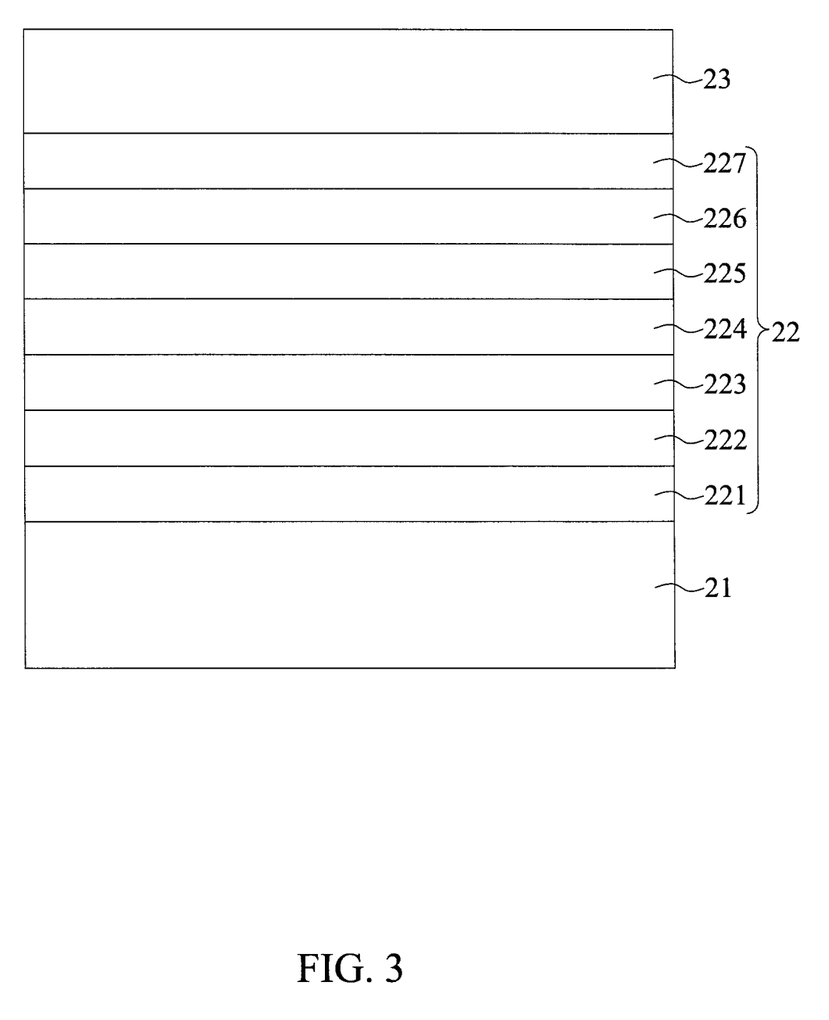
FIG. 3 is a schematic cross-sectional view showing a structure of an epitaxial layer formed between a substrate and a superlattice structure in the high electron mobility transistor according to the present invention.

As mentioned above, the epitaxial layer 22 between the substrate 21 and the superlattice structure 23 is a single-layer structure. In another embodiment, the epitaxial layer 22 also can be a multiple-layers structure as shown in FIG. 3. As illustrated in FIG. 3, the epitaxial layer 22 comprises a plurality of sub layers 221, 222, 223, 224, 225, 226, and 227 consisting of aluminum gallium nitride ($Al_xGa_{1-x}N$), so as to sequentially stack these layers from a side of the substrate 21 to a side of the superlattice structure 23, where the aluminum content x differs in each layer. For example, in the sub layer 221 attached to the substrate 21, the aluminum content x of the aluminum gallium nitride ($Al_xGa_{1-x}N$) is 1; the aluminum content x of the aluminum gallium nitride ($Al_xGa_{1-x}N$) in the sub layer 222 is 0.75; the aluminum content x of the aluminum gallium nitride ($Al_xGa_{1-x}N$) in the sub layer 223 is 0.56; the aluminum content x of the aluminum gallium nitride ($Al_xGa_{1-x}N$) in the sub layer 224 is 0.43; the aluminum content x of the aluminum gallium nitride ($Al_xGa_{1-x}N$) in the sub layer 225 is 0.34; the aluminum content x of the aluminum gallium nitride ($Al_xGa_{1-x}N$) in the sub layer 226 is 0.18; and the aluminum content x of the aluminum gallium nitride ($Al_xGa_{1-x}N$) in the sub layer 227 is 0, where the sub layer 227 is attached to the superlattice structure 23. Therefore, the aluminum content x gradually reduces from x=1 at the side of the substrate 21 to x=0 at the side of the superlattice layer 23.

The above embodiment is illustrated by the epitaxial layer 22 with 7 sub layers, but the number of layers of the multiple layers structure in the epitaxial layer 22 is not limited in the present invention. In addition, the present invention is not limited to the thickness of each layer, for example, the thickness of the sub layer 221 can be 76 nm; the thickness of the sub layer 222 can be 86 nm; the thickness of the sub layer 223 can be 133 nm; the thickness of the sub layer 224 can be 123 nm; the thickness of the sub layer 225 can be 133 nm; and the thickness of the sub layer 226 can be 143 nm, and so on. This will make the total thickness of the epitaxial layer 22 with multiple layers structure be more than 160 nm. The epitaxial layer 22 aims to reduce the tensile stress of the substrate 21 applied on the superlattice structure 23, so as to match the lattice thereof.

Figure 4:
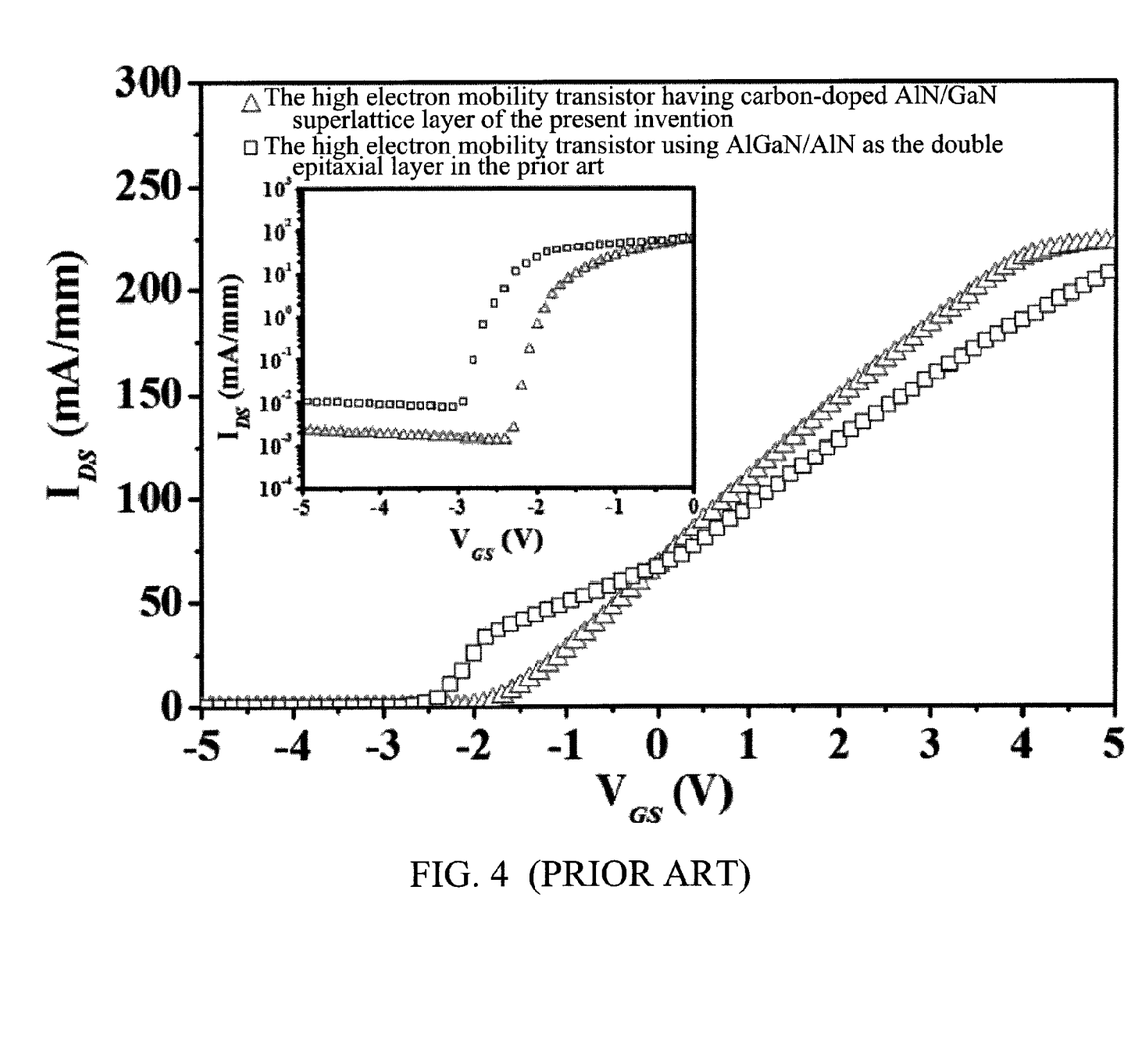
FIG. 4 is a comparison graph showing changes of the drain-source current ($I_{DS}$) to the gate-source voltage ($V_{GS}$) of the high electron mobility transistors between the prior art and the present invention.

As shown in FIG. 4, the high electron mobility transistor of the present invention is measured with the threshold voltage of −2V, and the high electron mobility transistor of the prior art is measured with the threshold voltage of −2.6V. In the comparison graph showing changes of the drain-source current (IDs) to the gate-source voltage ($V_{GS}$), it can be found that when the drain-source voltage ($V_{DS}$) is 5V, the operation voltage of the high electron mobility transistor of the present invention is −1.8V while the operation voltage of the high electron mobility transistor of the prior art is −2.8V. Accordingly, this shows that the high electron mobility transistor of the present invention achieves the effect of reducing the operation voltage.

Figure 5:
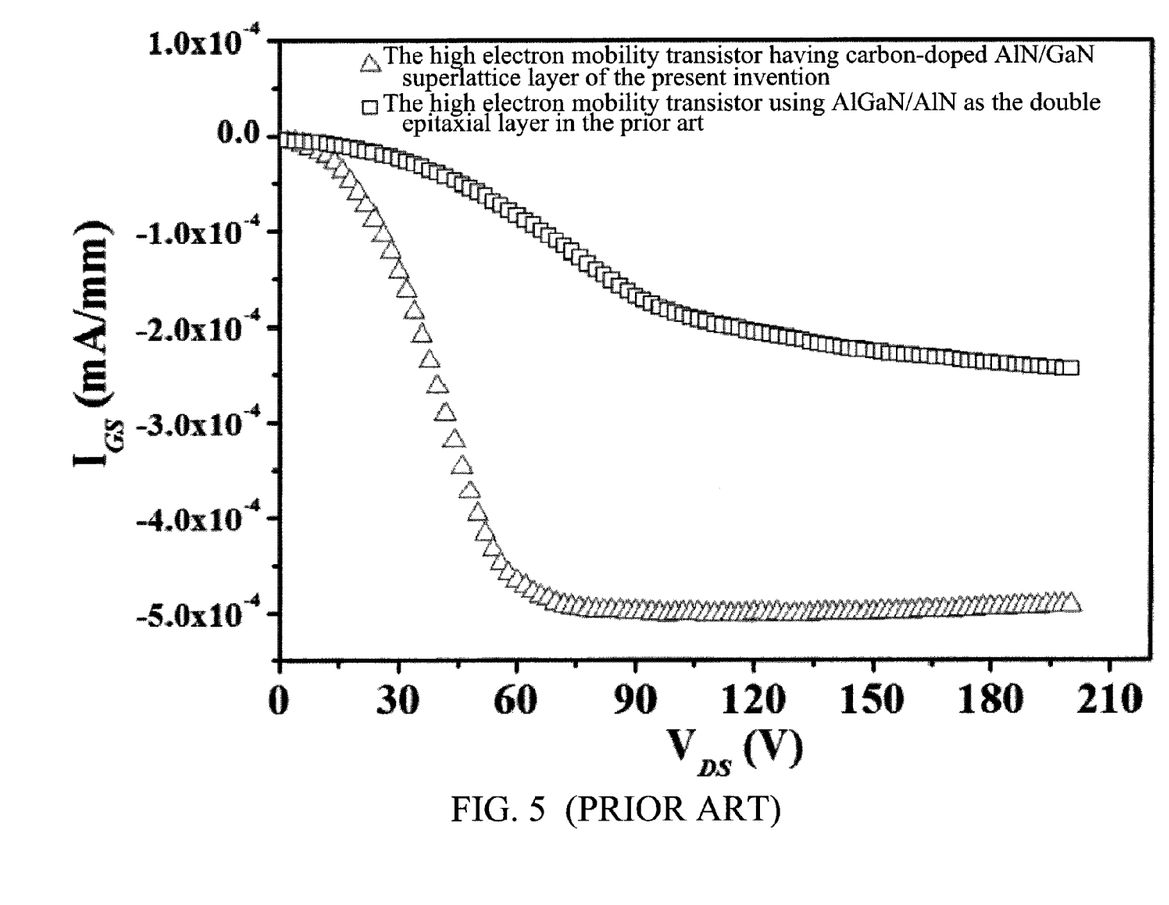
FIG. 5 is a comparison graph showing changes of the gate-source current ($I_{GS}$) to the drain-source voltage ($V_{DS}$) of the high electron mobility transistors between the prior art and the present invention.
Figure 6:
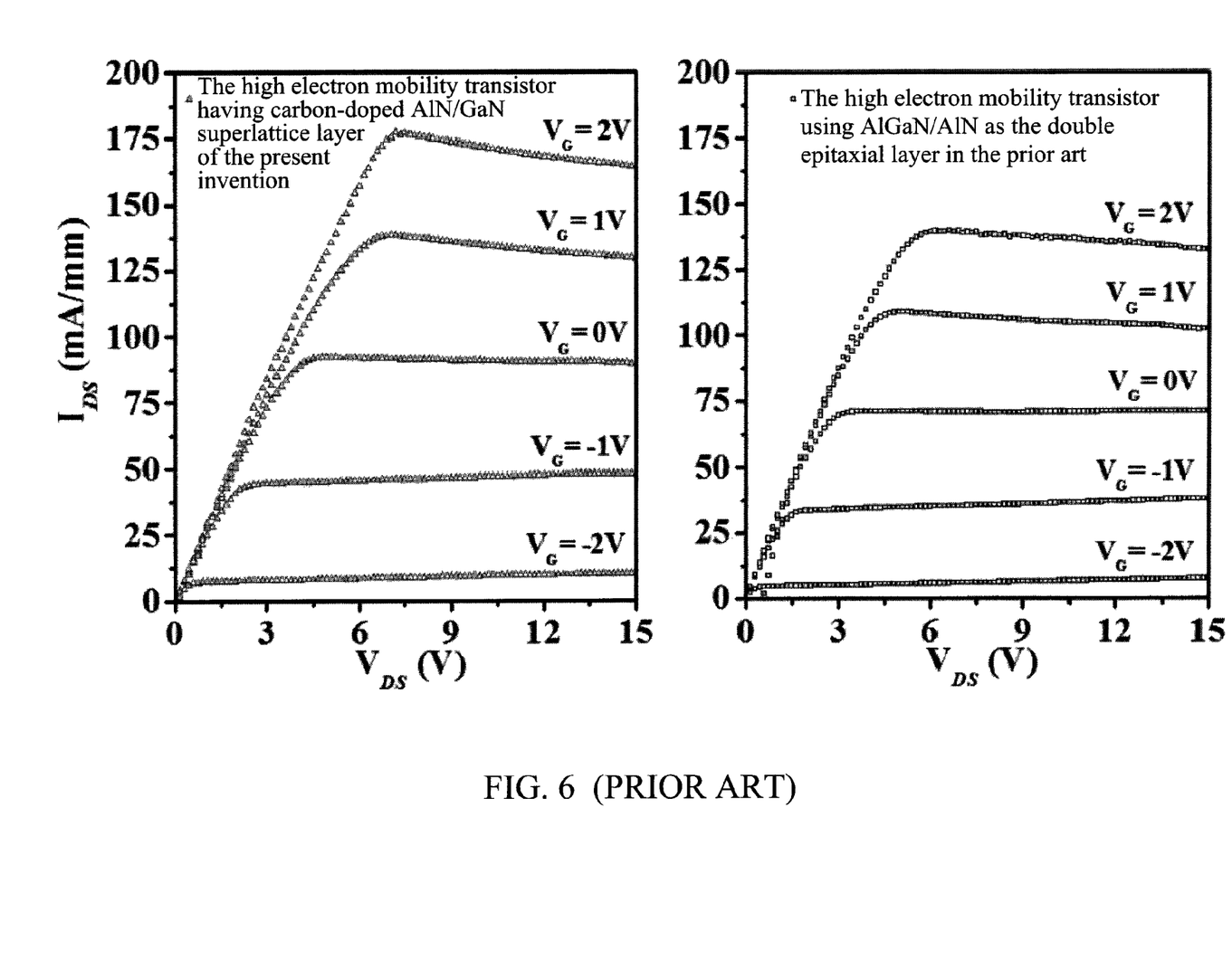
FIG. 6 is a comparison graph showing changes of the drain-source current ($I_{DS}$) to the drain-source voltage ($V_{DS}$) of the high electron mobility transistors between the prior art and the present invention under different gate voltages.
Figure 7:
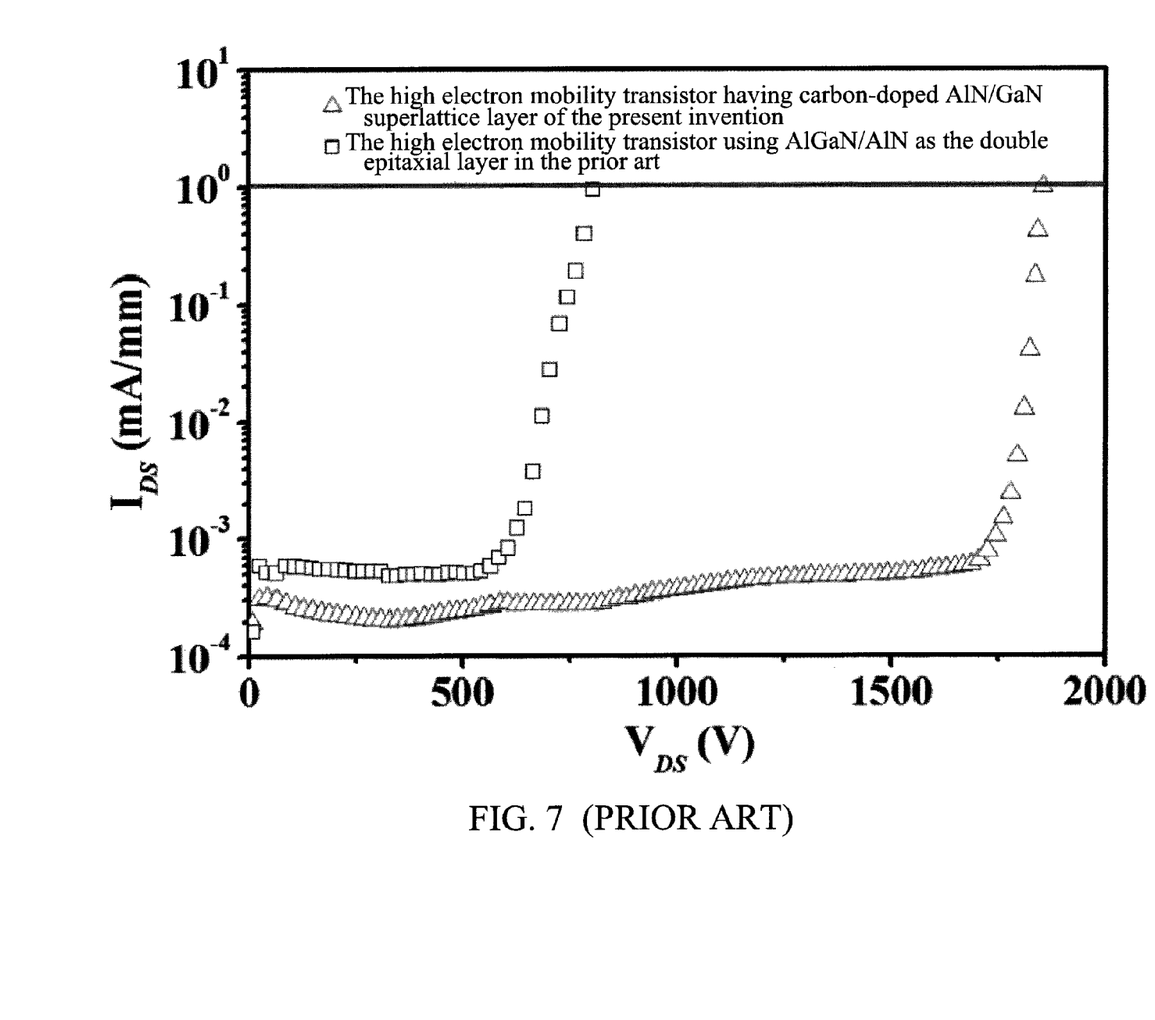
FIG. 7 is a comparison graph showing changes of the drain-source current ($I_{DS}$) to the drain-source voltage ($V_{DS}$) of the high electron mobility transistors between the prior art and the present invention.

FIG. 5 shows that the vertical leakage current of the high electron mobility transistor of the present invention is less than the vertical leakage current of the high electron mobility transistor of the prior art. Moreover, as shown in FIG. 6, when the gate-source voltage ($V_{GS}$) is 2V, the current density of the high electron mobility transistor of the present invention is 175 mA/mm, which is obviously higher than the current density of 130 mA/mm of the high electron mobility transistor of the prior art. In addition, as shown in FIG. 7, when the drain-source current ($I_{DS}$) is 1 mA/mm, the drain-source voltage ($V_{DS}$) of the high electron mobility transistor of the present invention is 1854 V, which is significantly higher than 800 V of that of the high electron mobility transistor of the prior art, i.e., the present invention indeed achieves the effect of enhancing the breakdown voltage.

By means of disposing the AlN/GaN superlattice structure with carbon doping of the high electron mobility transistor of the present invention between the substrate and the transistor epitaxial structure, the epitaxial quality and the film electric resistivity can be effectively improved, the vertical leakage current can be reduced, and the breakdown voltage of the high electron mobility transistor can be enhanced. The high electron mobility transistor of the present invention can indeed reduce the defect density to $10^7$ $cm^{-2}$. Also, the high electron mobility transistor of the present invention is compatible with all the growth method, such as metal-organic chemical vapor deposition (MOCVD), hydride vapor phase epitaxy (HVPE), molecular beam epitaxy MBE) or the gallium nitride series of hot wall epitaxy, etc.

The above embodiments are merely used to describe the principle, characteristic, and effect of the present invention, but not to limit the scope of the present invention. Anyone with ordinary skills in the arts can modify or change the above embodiments without departing from the spirit and scope of the disclosure. Accordingly, all modifications and variations completed by those with ordinary skill in the art should fall within the scope of present invention defined by the appended claims. The scope of the present invention should be specified as the appended claims.

What is claimed is:

1. A high electron mobility transistor, comprising:
   a substrate;
   an epitaxial layer consisting of aluminum gallium nitride ($Al_xGa_{1-x}N$) formed on the substrate, wherein x represents aluminum content in the aluminum gallium nitride, and $0 \leq x \leq 1$;
   a superlattice structure formed on the epitaxial layer; and
   a transistor epitaxial structure formed on the superlattice structure;
   wherein the superlattice structure is formed by alternately stacking a plurality of pairs of an aluminum nitride (AlN) layer and an gallium nitride (GaN) layer; and
   wherein the epitaxial layer includes a plurality of sub layers consisting of aluminum gallium nitride, and the sub layers are sequentially stacked from a side of the substrate to a side of the superlattice structure, wherein the aluminum content x gradually reduces from x=1 at the side of the substrate to x=0 at the side of the superlattice structure.

2. The high electron mobility transistor according to claim 1, wherein the aluminum nitride layer or the gallium nitride layer comprises a dopant of carbon (C), tellurium (Te), iron (Fe), magnesium (Mg) or zinc (Zn), and a doping concentration of the dopant is larger than or equal to $1 \times 10^{16}$ $cm^{-3}$.

3. The high electron mobility transistor according to claim 2, wherein a number of alternately stacked pairs of the aluminum nitride layer and the gallium nitride layer is ranged from 5 to 120.

4. The high electron mobility transistor according to claim 3, wherein a thickness of the aluminum nitride layer in each of the alternately stacked pairs is ranged from 2 to 6 nm.

5. The high electron mobility transistor according to claim 3, wherein a thickness of the gallium nitride layer in each of the alternately stacked pairs is ranged from 10 to 30 nm.

6. The high electron mobility transistor according to claim 1, wherein the transistor epitaxial structure comprises:
   a buffer layer formed on the superlattice layer;
   a channel layer formed on the buffer layer;
   a barrier layer formed on the channel layer; and
   a covering layer formed on the barrier layer, and having a source, a drain and a gate individually formed thereon.

7. The high electron mobility transistor according to claim 6, wherein the buffer layer consists of aluminum gallium nitride ($Al_sGa_{1-s}N$), wherein s represent aluminum content in the aluminum gallium nitride, and $0 \leq s \leq 1$.

8. The high electron mobility transistor according to claim 7, wherein the buffer layer has a dopant of carbon (C) or no doping, and a thickness of the buffer layer is 1.32 μm.

9. The high electron mobility transistor according to claim 6, wherein the channel layer consists of non-doped gallium nitride (GaN), and a thickness of the channel layer is 0.3 μm.

10. The high electron mobility transistor according to claim 6, wherein the barrier layer consists of aluminum gallium nitride ($Al_vGa_{1-v}N$), wherein v represents aluminum content in the aluminum gallium nitride and is 0.25, and a thickness of the barrier layer is 20 nm.

11. The high electron mobility transistor according to claim 6, wherein the covering layer consists of non-doped gallium nitride (GaN), and a thickness of the covering layer is 2 nm.

12. The high electron mobility transistor according to claim 1, wherein the substrate is made of a material selected from the group consisting of sapphire, silicon carbide (SiC), zinc oxide (ZnO), Silicon (Si), gallium oxide ($Ga_2O_3$), and gallium nitride (GaN).

* * * * *